(12) United States Patent
Kandah

(10) Patent No.: US 8,885,310 B2
(45) Date of Patent: Nov. 11, 2014

(54) GATE DRIVER WITH DESATURATION DETECTION AND ACTIVE CLAMPING

(71) Applicant: Ibrahim S. Kandah, Canton, MI (US)

(72) Inventor: Ibrahim S. Kandah, Canton, MI (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/665,518

(22) Filed: Oct. 31, 2012

(65) Prior Publication Data

US 2014/0118874 A1    May 1, 2014

(51) Int. Cl.
*H02H 3/08* (2006.01)
*H03K 17/687* (2006.01)

(52) U.S. Cl.
USPC .......................................... 361/93.1; 327/434

(58) Field of Classification Search
USPC ............................ 361/93.1; 324/434; 327/434
See application file for complete search history.

(56) References Cited

U.S. PATENT DOCUMENTS

| | | | |
|---|---|---|---|
| 5,500,616 A | 3/1996 | Ochi | |
| 6,097,582 A * | 8/2000 | John et al. | 361/79 |
| 6,275,093 B1 * | 8/2001 | Shekhawat et al. | 327/434 |
| 7,080,639 B1 * | 7/2006 | Pattantyus | 123/651 |
| 7,570,101 B1 * | 8/2009 | Short et al. | 327/432 |
| 2004/0120090 A1 * | 6/2004 | Galli et al. | 361/115 |
| 2006/0044025 A1 * | 3/2006 | Grbovic | 327/112 |
| 2008/0030257 A1 * | 2/2008 | Jasberg et al. | 327/434 |
| 2008/0238520 A1 * | 10/2008 | de Rooij et al. | 327/310 |
| 2009/0153223 A1 * | 6/2009 | Bayerer | 327/389 |

OTHER PUBLICATIONS

Rüedi et al., "Advantages of Advanced Active Clamping," Power Electronics Europe, Issue 8, pp. 27-29, Nov./Dec. 2009.

* cited by examiner

*Primary Examiner* — Scott Bauer
(74) *Attorney, Agent, or Firm* — Ingrassia Fisher & Lorenz, P.C.

(57) ABSTRACT

Apparatus, systems, and methods are provided for protecting a switching device using a gate driver device. An exemplary gate driver system includes an interface for coupling to a switching device, a desaturation detection arrangement coupled to the interface to detect a desaturation condition based on an electrical characteristic at the interface, and a deactivation arrangement coupled to the interface to deactivate the switching device in a manner that is influenced by the electrical characteristic at the interface. In one embodiment, the switching device is deactivated by providing a deactivation current to a control terminal of the switching device and adjusting the deactivation current based on an electrical characteristic at the interface.

17 Claims, 4 Drawing Sheets

GATE DRIVER WITH DESATURATION DETECTION AND ACTIVE CLAMPING

TECHNICAL FIELD

Embodiments of the subject matter described herein relate generally to electronic circuits, and more particularly, embodiments of the subject matter relate to providing desaturation and turn-off overvoltage protection for switching devices.

BACKGROUND

Transistors and other switching devices are widely used in modern electronic applications. In practice, electrical parasitics within electrical circuits are unavoidable due to physical non-idealities. These electrical parasitics can have potentially damaging side effects for higher power applications or other applications at higher switching frequencies. For example, when a switching device is switched off and current is prevented from flowing through a parasitic inductance, a corresponding voltage is created within the circuit. This, in turn, may result in a voltage across the switching device that exceeds the device breakdown voltage, thereby compromising future operation of the switching device. Accordingly, it is desirable to protect switching devices from potentially damaging turn-off over-voltages. However, most prior art approaches require an undesirably high number of components, particularly in view of the other components used to provide other types of protection (e.g., desaturation protection or the like). Additionally, some prior art approaches, such as soft turn off, may compromise the overall performance.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

Figure 1:
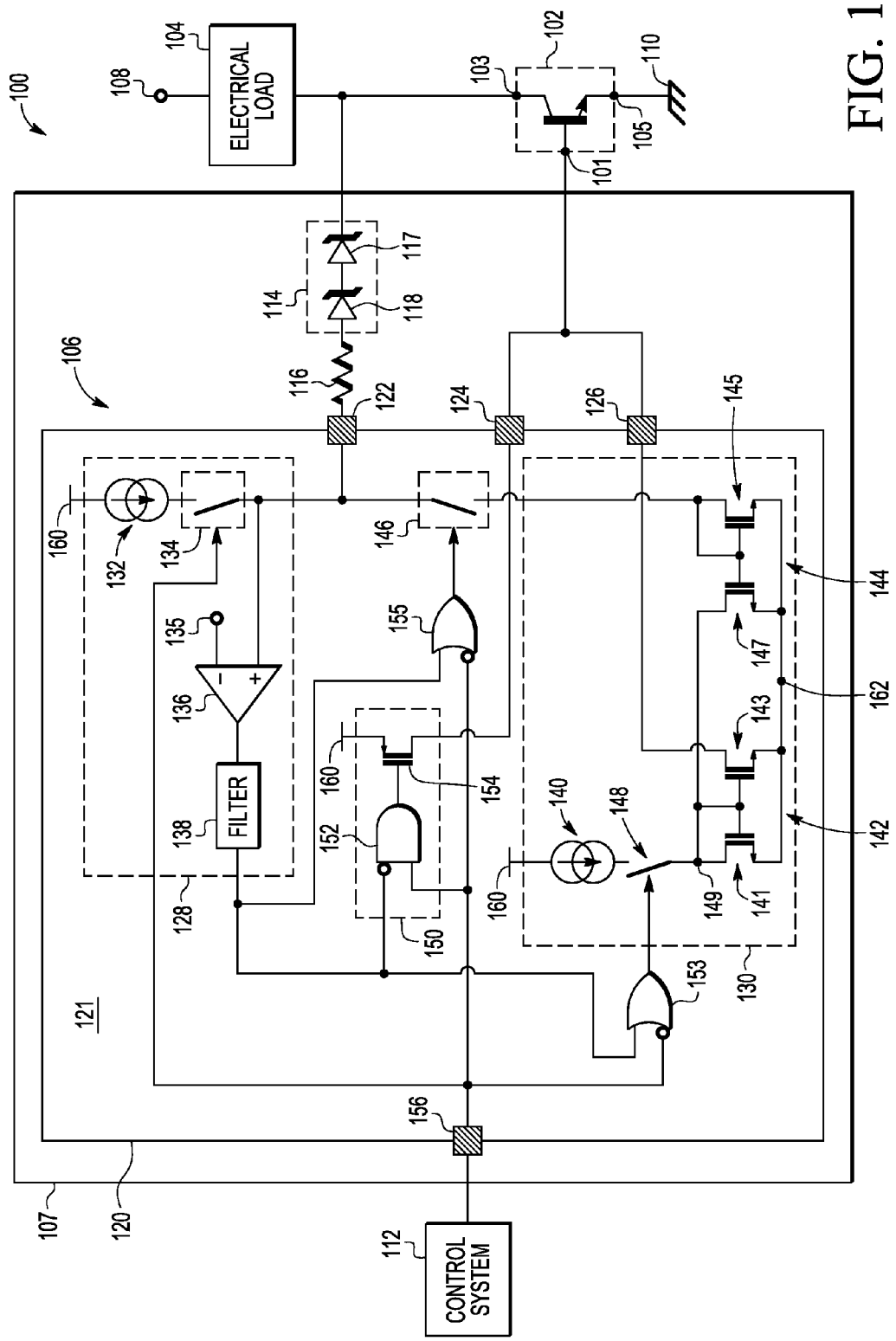
FIG. 1 is a schematic diagram of an exemplary electrical system in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following Embodiments of the subject matter described herein relate to operating switching devices while providing desaturation protection when the switching device conducts current or is otherwise activated and providing overvoltage protection when the switching device stops conducting current or is otherwise deactivated. As described in greater detail below, in exemplary embodiments, a gate driver device package includes a first package interface that is coupled to a terminal of a switching device via a zener diode arrangement configured in series between the first package interface and the terminal. The gate driver device package includes a desaturation detection arrangement coupled to that package interface that detects or otherwise identifies a desaturation condition based on an electrical characteristic at that package interface (e.g., a voltage or current) while the switching device is activated. As used herein, a desaturation condition should be understood as referring to a condition within an electrical system that results in a voltage across the switching device while the switching device is activated (e.g., closed or turned on) that exceeds the expected voltage across the switching device at saturation.

As described below, the gate driver device package also includes a deactivation arrangement coupled to that package interface that deactivates or otherwise turns off the switching device in a manner that is influenced by an electrical characteristic at that package interface indicative of a potential overvoltage condition. Thus, the zener diode arrangement is utilized as part of the desaturation protection scheme as well as the overvoltage protection scheme, thereby reducing costs in terms of parts and/or area required for providing both types of protection. As used herein, an overvoltage condition should be understood as referring to a condition within an electrical system that may result in a voltage across the switching device while the switching device is being deactivated that exceeds a breakdown voltage of the switching device. In this regard, the deactivation arrangement may reduce the rate at which the switching device is turned off to inhibit or otherwise reduce the likelihood of the voltage across the switching device exceeding the breakdown voltage, thereby maintaining a voltage across the switching device during deactivation that is less than the breakdown voltage, also referred to as active clamping.

Turning now to FIG. 1, an exemplary electrical system 100 includes, without limitation, a switching device 102 coupled to an electrical load 104, and a gate drive system 106 coupled to the switching device 102 to control operation of the switching device 102. In this regard, the switching device 102 may be part of a power converter, wherein the gate drive system 106 alternately activates the switching device 102 to allow a current to flow between nodes 108, 110 through the electrical load 104 or deactivates the switching device 102 to prevent the flow of current between nodes 108, 110 through the electrical load 104 in response to control signals received from a supervisory control system 112, thereby regulating the voltage and/or current provided to the electrical load 104. The gate drive system 106 includes a gate driver circuit 120 (or gate driver) and a zener diode arrangement 114 coupled electrically in series between an interface 122 of the gate driver 120 and a terminal 103 of the switching device 102.

In exemplary embodiments, gate driver 120 includes a desaturation detection arrangement 128 coupled to the interface 122 and a deactivation arrangement 130 that is also coupled to the interface 122. As described in greater detail below, when the switching device 102 is activated, the desaturation detection arrangement 128 detects a desaturation condition of the switching device 102 based on a voltage at the interface 122. The deactivation arrangement 130 is coupled to a control terminal 101 of the switching device 102 via another interface 126 and provides a deactivation current at the control terminal interface 126 in a manner that is influenced by the voltage at the first interface 122 to regulate or otherwise control the voltage at the terminal 103 of the switching device 102 when the switching device 102 is deactivated, thereby protecting the switching device 102 from potentially damaging turn-off overvoltages (e.g., a potential overvoltage condition). It should be understood that FIG. 1 is a simplified representation of the electrical system 100 for purposes of explanation and ease of description, and FIG. 1 is not intended to limit the application or scope of the subject matter in any way. Thus, although FIG. 1 depicts direct electrical connections between circuit elements and/or terminals, alternative embodiments may employ intervening circuit elements and/or components while functioning in a substantially similar manner In exemplary embodiments, the switching device 102 is realized as a transistor or another suitable semiconductor switching device configured to allow current flow between electrode terminals 103, 105 based on a control signal applied to the control terminal 101. For example, the switching device 102 may be realized as an insulated-gate bipolar transistor (IGBT) that allows unidirectional current flow from the collector terminal to the emitter terminal when a voltage difference between the emitter terminal and the input control signal applied at the gate terminal exceeds a threshold value. For convenience and ease of description, the subject matter may be described herein in the context of the switching device 102 being realized as an IGBT, however, it should be noted that the subject matter described herein is not limited to use with IGBTs, and in practical embodiments, the switching device 102 may be realized as a field-effect transistor (FET), a bipolar junction transistor (BJT) or any other suitable transistor switching device. For the IGBT embodiment, the emitter terminal 105 is coupled to a node 110 configured to receive a negative reference voltage for the electrical system 100 and the collector terminal 103 is coupled to a node 108 configured to receive a positive reference voltage for the electrical system 100.

In accordance with one or more embodiments, the switching device 102 is implemented as part of a power conversion module, such as, for example, a power inverter module, wherein the positive reference voltage node 108 is realized as a positive voltage rail of an electrical bus (which may be coupled to a positive voltage terminal of a DC energy source) and the negative reference voltage node 110 is realized as the negative voltage rail of the electrical bus (which may be coupled to a negative voltage terminal of a DC energy source). In this regard, the switching device 102 may operate in conjunction with another switching device provided between the electrical load 104 and node 108 (e.g., in a half-bridge configuration) to regulate the current to the electrical load 104.

The electrical load 104 may be realized as any suitable electrical device or electrical component controllable by the switching device 102, or any suitable combination thereof, such as, for example, an electric motor or another transducer. The electrical load 104 may be inductive or otherwise include parasitic inductances such that the electrical load 104 may generate a voltage at the terminal 103 of the switching device 102 in response to current flow through the electrical load 104 being interrupted by the switching device 102 being opened, turned off, or otherwise deactivated. The control system 112 generally represents one or more processors, controllers, or other components of the electrical system 100 that determine duty cycles for operating the switching device 102 and provide corresponding control signals to an input interface 156 of the gate driver 120, which, in turn, operates the switching device 102 in the corresponding manner (e.g., by activating and deactivating the switching device 102 with the desired duty cycles), as described in greater detail below.

In exemplary embodiment, the gate drive system 106 is affixed, mounted, formed, or otherwise provided on an electronics substrate 107, such as a power electronics substrate, a printed circuit board, or the like. In the illustrated embodiment, the gate driver 120 is realized as an integrated circuit that is soldered, affixed, or otherwise mounted to the electronics substrate. In other words, the desaturation detection arrangement 128, the deactivation arrangement 130, and the other elements of the gate driver 120 may be formed or otherwise provided on a package substrate 121 and encapsulated in a common standalone device package. As illustrated in FIG. 1, the gate drive system 106 also includes the zener diode arrangement 114 and a resistive element 116, which are realized using discrete components that are soldered, mounted, or otherwise affixed to the substrate 107 and coupled to the first interface 122 of the gate driver device package using conductive traces, wires, or the like. However, it should be noted that in alternative embodiments, the resistive element 116 and/or the zener diode arrangement 114 may be integrated or otherwise provided within the gate driver device package 120, for example, by being fabricated or otherwise provided on the package substrate 121.

As illustrated in FIG. 1, the zener diode arrangement 114 includes one or more zener diodes 117, 118 configured electrically in series between the first package interface 122 of the gate driver 120 and the collector terminal 103 of the switching device 102 to provide bidirectional current flow between the interface 122 and the collector terminal 103. In exemplary embodiments, the zener diode arrangement 114 is configured such that a bias voltage required for current flow from the first package interface 122 to the collector terminal 103 is less than a bias voltage required for current flow from the collector terminal 103 to the first package interface 122. Accordingly, the zener diode arrangement 114 is forward-biased when current flows from the first package interface 122 to the collector terminal 103 and reverse-biased when current flows from the collector terminal 103 to the first package interface 122. In the illustrated embodiment, the zener diode arrangement 114 includes a first zener diode having its cathode terminal coupled to the collector terminal 103 and its anode terminal coupled to the cathode terminal of a second zener diode 118, wherein the resistive element 116 is coupled electrically in series between the interface 122 and the anode terminal of the second zener diode 118, so that the resistive element 116 and the zener diodes 117, 118 are electrically in series between the interface 122 and the collector terminal 103.

In exemplary embodiments, the total reverse bias voltage of the zener diode arrangement 114 is greater than the nominal direct current (DC) voltage between nodes 108, 110 but less than or equal to the collector-to-emitter breakdown voltage of the switching device 102. In this manner, the zener diode arrangement 114 helps prevent the voltage at the collector terminal 103 from exceeding that breakdown voltage in conjunction with the deactivation arrangement 130, which effectively clamps the zener diode arrangement 114 to the control terminal 101 of the switching device 102 (e.g., active clamping), as described in greater detail below. For example, in accordance with one embodiment, the switching device 102 has a collector-to-emitter breakdown voltage of about 650 Volts (V), the nominal DC voltage between nodes 108, 110 is about 300V, and the total reverse bias voltage of the zener diode arrangement 114 is in the range of about 400V to about 450V. The resistive element 116 may be realized as one or more resistors or any other element capable of providing a desired series resistance between the interface 122 and the collector terminal 103. In accordance with one embodiment, the resistance of the resistive element 116 is about 4 kilohms.

Still referring to FIG. 1, in exemplary embodiments, in addition to the collector terminal package interface 122, the gate driver 120 includes package interfaces 124, 126 coupled to the gate terminal 101 of the switching device 102. Each of the package interfaces 122, 124, 126 may be realized as an individual pin, lead, terminal, or another physical interface to the gate driver device package 120. In the illustrated embodiment, the gate driver 120 includes an activation arrangement 150 configured to provide a voltage from a positive reference voltage node 160 of the gate driver 120 to the gate terminal 101 of the switching device 102 via the first gate terminal package interface 124 in response to a control signal from the control system 112 indicative of a desire to close, turn on, or otherwise activate the switching device 102, or alternatively, to remove the voltage from the gate terminal 101 of the switching device 102 in response to an indication that the switching device 102 should be opened, turned off, or otherwise deactivated. In this regard, the voltage at the gate driver positive reference voltage node 160 is chosen so that the voltage difference between the gate terminal 101 and the emitter terminal 105 is greater than the threshold voltage of the switching device 102 (but less than the maximum rated gate-to-emitter voltage) when the activation circuitry couples the gate driver positive reference voltage node 160 to the interface 124. In the illustrated embodiment, the activation arrangement 150 includes a switching element 154, such as PMOS transistor having a source terminal coupled to node 160, a drain terminal coupled to the interface 124, and a gate terminal coupled to the output of an AND logic gate 152. A first input of the AND logic gate 152 is coupled to an input interface 156 of the gate driver 120, wherein the input interface 156 is coupled to the control system 112 to receive a control signal indicative of a desire to activate the switching device 102. As described below, a second input of the AND logic gate 152 is coupled to the output of the desaturation detection arrangement 128 and configured such that the AND logic gate 152 only activates the switching device 102 when the control signal at the input interface 156 indicates a desire to activate the switching device (e.g., a logical high voltage) and the output of the desaturation detection arrangement does not indicate a desaturation condition of the switching device 102. When the control signal at the input interface 156 indicates a desire to activate the switching device and the output of the desaturation detection arrangement does not indicate a desaturation condition of the switching device 102, the AND logic gate 152 operates the switching element 154 to effectively connect the first gate terminal interface 124 to node 160. It should be noted that although FIG. 1 depicts separate package interfaces 124, 126 being coupled to the gate terminal 101, in some embodiments, the gate driver 120 may include only a single package interface coupled to the gate terminal 101, in which case the activation arrangement 150 and deactivation arrangement 130 may be coupled to one another at that package interface. That said, separate package interfaces 124, 126 allows for external circuitry to be used to separately tune the turn on and turn off of the switching device 102, as will be appreciated in the art.

As described in greater detail below, the desaturation detection arrangement 128 detects or otherwise identifies a potential desaturation condition of the switching device 102 when the voltage at the interface 122 exceeds the expected collector voltage at saturation of the switching device 102 or otherwise indicates that an unintended voltage is accumulating across the switching device 102 while the switching device 102 is turned on (e.g., due to a short-circuit or another fault elsewhere within the electrical system 100). The illustrated desaturation detection arrangement 128 includes a desaturation reference current source 132, a switching element 134, a comparator arrangement 136, and a filter 138. The switching element 134 is coupled between the desaturation reference current source 132 and the interface 122 and configured to provide a desaturation reference current from the desaturation reference current source 132 to the collector terminal interface 122 when the control signal at the input interface 156 indicates that the switching device 102 should be activated. For example, the switching element 134 may be realized as a PMOS transistor having its source terminal coupled to the desaturation reference current source 132, its drain terminal coupled to the interface 122, and its gate terminal coupled to the input interface 156. In this manner, the desaturation reference current source 132 provides the desaturation reference current from node 160 to the interface 122 when the switching element 134 is activated. The total forward bias voltage of the zener diode arrangement 114 is chosen such that the sum of the total forward bias voltages across the zener diodes 117, 118, the voltage across the resistive element 116, and the voltage difference between the collector and emitter terminals 103, 105 of the switching device 102 when the switching device 102 is activated is less than the gate driver positive reference voltage at node 160, so that the desaturation reference current flows from the interface 122 through the resistive element 116 and the zener diode arrangement 114 when the switching device 102 is activated.

The comparator arrangement 136 may be realized as an operational amplifier voltage comparator or other suitable voltage comparison circuitry having a first input coupled to the collector terminal interface 122 and a second input coupled to a node 135 configured to receive a desaturation reference voltage. In this regard, the desaturation reference voltage is chosen to be greater than a sum of the forward bias voltages of the zener diodes 117, 118, the voltage across the resistive element 116 when the switching element 134 is activated, and the voltage difference between collector and emitter terminals 103, 105 when the switching device 102 is activated by an amount indicative of an unintended voltage accumulation across the switching device 102. For example, in exemplary embodiments, the nominal collector voltage at the collector terminal 103 (relative to the emitter terminal 105 and/or node 110) when the switching device 102 is saturated is in the range of about 2V to about 5V, wherein the desaturation detection arrangement 128 is configured to provide a desaturation reference voltage at node 135 greater than or equal to the sum of the forward bias voltages of the zener diodes 117, 118 and the expected voltage across the resistive element 116 plus about 5V. In this manner, during normal operation, when the switching device 102 is activated, the desaturation reference voltage at node 135 is greater than the voltage at the collector terminal interface 122 and the comparator arrangement 136 provides a logical low output voltage. Conversely, when a desaturation condition exists, the voltage at the collector terminal 103 increases, which, in turn, causes the voltage at the interface 122 to exceed the desaturation reference voltage at node 135, which, in turn, causes the comparator arrangement 136 to generate a logical high output voltage signal indicative of the desaturation condition.

In exemplary embodiments, the filter 138 is coupled to the output of the comparator arrangement 136 to provide sufficient time for the switching device 102 to be fully turned on (and thereby allow the voltage at the collector terminal 103 to reach the expected saturation collector voltage) before generating a logical high output voltage signal and filter out any other transient glitches that may otherwise be exhibited by the comparator arrangement 136 during operation while still providing adequate desaturation protection when the switching device 102 is turned on while a fault condition exists elsewhere within the electrical system 100. As described above, when the output of the desaturation detection arrangement 128 (e.g., the output of the filter 138) indicates a desaturation condition, the AND logic gate 152 deactivates the switching element 154, thereby removing the gate driver positive reference voltage from the first gate terminal interface 124 and/or gate terminal 101 of the switching device 102.

In an exemplary embodiment, the output of the desaturation detection arrangement 128 is coupled to the deactivation arrangement 130 to enable the deactivation arrangement 130 opening, turning off, or otherwise deactivating the switching device 102 in response to a desaturation condition. The deactivation arrangement 130 includes a deactivation reference current source 140, a first current mirror arrangement 142 that is coupled to the deactivation reference current source 140 at node 149 and to the second gate terminal interface 126, a second current mirror arrangement 144 that is coupled to the deactivation reference current source 140 at node 149 and to the collector terminal interface 122 via a switching element 146, and a switching element 148 coupled between the deactivation reference current source 140 and the current mirror arrangements 142, 144 at node 149. In the illustrated embodiment, the gate driver 120 includes logic OR gates 153, 155 coupled to the respective switching elements 146, 148 to close, turn on, or otherwise activate the switching elements 146, 148 when the control signal from the control system 112 indicates a desire to deactivate the switching device (e.g., a logical low voltage at the input interface 156) or when the output of the desaturation detection arrangement 128 indicates a desaturation condition of the switching device 102. In this manner, the switching elements 146, 148 are coupled to the output of the desaturation detection arrangement 128 so that the desaturation detection arrangement 128 enables or otherwise activates the deactivation arrangement 130 to provide a deactivation current to the gate terminal 101 of the switching device 102 at the second gate terminal interface 126, as described in greater detail below.

When the switching element 148 is closed (or activated), the deactivation reference current source 140 provides a reference current from node 160 to the node 149 coupled to each of the current mirror arrangements 142, 144. The first current mirror arrangement 142 is coupled to the node 149 and the second gate terminal interface 126 to generate a deactivation current provided at the second gate terminal interface 126 by mirroring at least a portion of the current at node 149 and drawing a proportional amount of current from the second gate terminal interface 126. In this regard, the transistors 141, 143 of the first current mirror arrangement 142 may be sized relative to one another or otherwise configured so that the mirrored current drawn from the second gate terminal interface 126 is a multiple of the portion of the deactivation reference current at node 149 that flows through transistor 141. For example, the transconductance of transistor 143 may be a multiple of the transconductance of transistor 141 or one or more additional transistors may be cascoded or otherwise provided in series between transistor 143 and the second gate terminal interface 126 to multiply the mirrored current. The illustrated first current mirror arrangement 142 includes a first NMOS transistor 141 having its drain and gate terminals coupled to the node 149 and its source terminal coupled to a node 162 configured to receive a negative reference voltage for the gate driver 120, and a second NMOS transistor 143 having its gate terminal coupled to node 149 and its source terminal coupled to node 162, wherein the drain terminal of the second NMOS transistor 143 is coupled to the second gate terminal interface 126 to provide the deactivation current (e.g., the mirrored multiple of the portion of the reference current that flows though transistor 141) at the second gate terminal interface 126.

The second current mirror arrangement 144 is coupled to the node 149 to adjust the deactivation current provided at the second gate terminal interface 126 by reducing the mirrored portion of the current at node 149 based on a voltage at the collector terminal interface 122 indicative of a potential overvoltage condition. As illustrated, the second current mirror arrangement 144 includes a third NMOS transistor 145 having its drain and gate terminals coupled to the collector terminal interface 122 (via switching element 146) and its source terminal coupled to node 162, and a fourth NMOS transistor 147 having its drain terminal coupled to node 149 and its source terminal coupled to node 162, wherein the gate terminal of the fourth NMOS transistor 147 is coupled to the gate terminal of the third transistor 145 to draw, from the reference current at node 149, a mirrored current that is substantially equal to the current through the third transistor 145. In this manner, the second current mirror arrangement 144 decreases or otherwise reduces the deactivation current at the second gate terminal interface 126 by subtracting the current flowing through the zener diode arrangement 114 and resistive element 116 and into the collector terminal interface 122 from the reference current provided by the deactivation reference current source 140, such that the portion of the deactivation current provided at the second gate terminal interface 126 is proportional to the reference current provided by the deactivation reference current source 140 minus the current through the third transistor 145. In this manner, the deactivation arrangement 130 reduces the deactivation current provided at the second gate terminal interface 126 based on the current flowing in to the collector terminal package interface 122 (which is influenced by the voltage at the collector terminal package interface 122).

By virtue of the zener diode arrangement 114, any voltage at the collector terminal interface 122 that exceeds the threshold voltage of the third transistor 145 is indicative of a potential overvoltage condition because it requires that the voltage at the collector terminal 103 exceed the total reverse bias voltage of the zener diode arrangement 114 (as well as the voltage drop across the resistive element 116) when the switching element 134 is opened or otherwise deactivated. In this manner, the deactivation arrangement 130 effectively clamps the zener diode arrangement 114 and the resistive element 116 from the collector terminal 103 to the gate terminal 101 by reducing the deactivation current drawn from the gate terminal 101 when the voltage at the collector terminal 103 reverse biases the zener diode arrangement 114 to thereby slow the rate at which the switching device 102 is deactivated and mitigate the potential overvoltage condition. In one embodiment, the activation of switching element 146 is delayed relative to the activation of switching element 148 to prevent currents attributable to the junction capacitance of the zener diodes 117, 118 from undesirably influencing the deactivation current at the second gate terminal interface 126.

As described in greater detail below in the context of FIG. 2, in accordance with one or more embodiments, the deactivation reference current source 140 is programmable or otherwise configurable to provide a variable reference current or otherwise optimize the deactivation of the switching device 102. For example, the output of the logic OR gate 153 may be coupled to the deactivation reference current source 140 to enable or otherwise activate the deactivation reference current source 140, wherein the deactivation reference current source 140 initially provides the reference current with a first magnitude (e.g., 12 amperes) for a first duration of time when the deactivation reference current source 140 is initially activated and thereafter provides a reference current with a different or lesser magnitude (e.g., 2 amperes). In other embodiments, the gate driver 120 may include other logic coupled to the deactivation reference current source 140 that allows the reference current to be varied (e.g., by the control system 112 or some other component in the electrical system 100).

Still referring to FIG. 1, when the switching elements 146, 148 are initially activated to deactivate the switching device 102, the voltage at the collector terminal 103 is likely to be less than the total reverse bias voltage of the zener diode arrangement 114. As a result, substantially zero current flows into the collector terminal interface 122 and through transistor 145, and the entire reference current provided by the deactivation reference current source 140 flows through the first current mirror arrangement 142. This results in a deactivation current that is proportional to (or a multiple of) the reference current from the deactivation reference current source 140 being initially provided at the second gate terminal interface 126 to pull the voltage at the gate terminal 101 to the voltage at node 162 and thereby deactivate or otherwise turn off the switching device 102. As the switching device 102 is deactivated, the voltage difference between the collector and emitter terminals 103, 105 increases. If the voltage at the collector terminal 103 exceeds the total reverse bias voltage of the zener diode arrangement 114 (e.g., due to voltage spikes caused by inductances associated with the electrical load 104 or elsewhere within the electrical system 100), current flows away from the collector terminal 103 through the zener diode arrangement 114 and the resistive element 116 into the collector terminal interface 122, thereby raising the voltage of the collector terminal interface 122. As a result of the voltage at the collector terminal interface 122 exceeding the threshold voltage of the transistor 145 and indicating a potential overvoltage condition, current flows through the second current mirror arrangement 144 to reduce the mirrored multiple of the reference current provided at the second gate terminal interface 126 is reduced, thereby slowing the rate at which the switching device 102 is deactivated and inhibiting the generation of turn-off voltages by inductances within the electrical system 100. In this manner, the deactivation arrangement 130 and the zener diode arrangement 114 cooperate to actively clamp or otherwise limit the voltage across the switching device 102 by limiting the rate at which the voltage at the gate terminal 101 is reduced based on the voltage at the collector terminal interface 122, thereby protecting the switching device 102 from turn-off voltages that could potentially exceed the collector-to-emitter breakdown voltage of the switching device 102.

Figure 2:
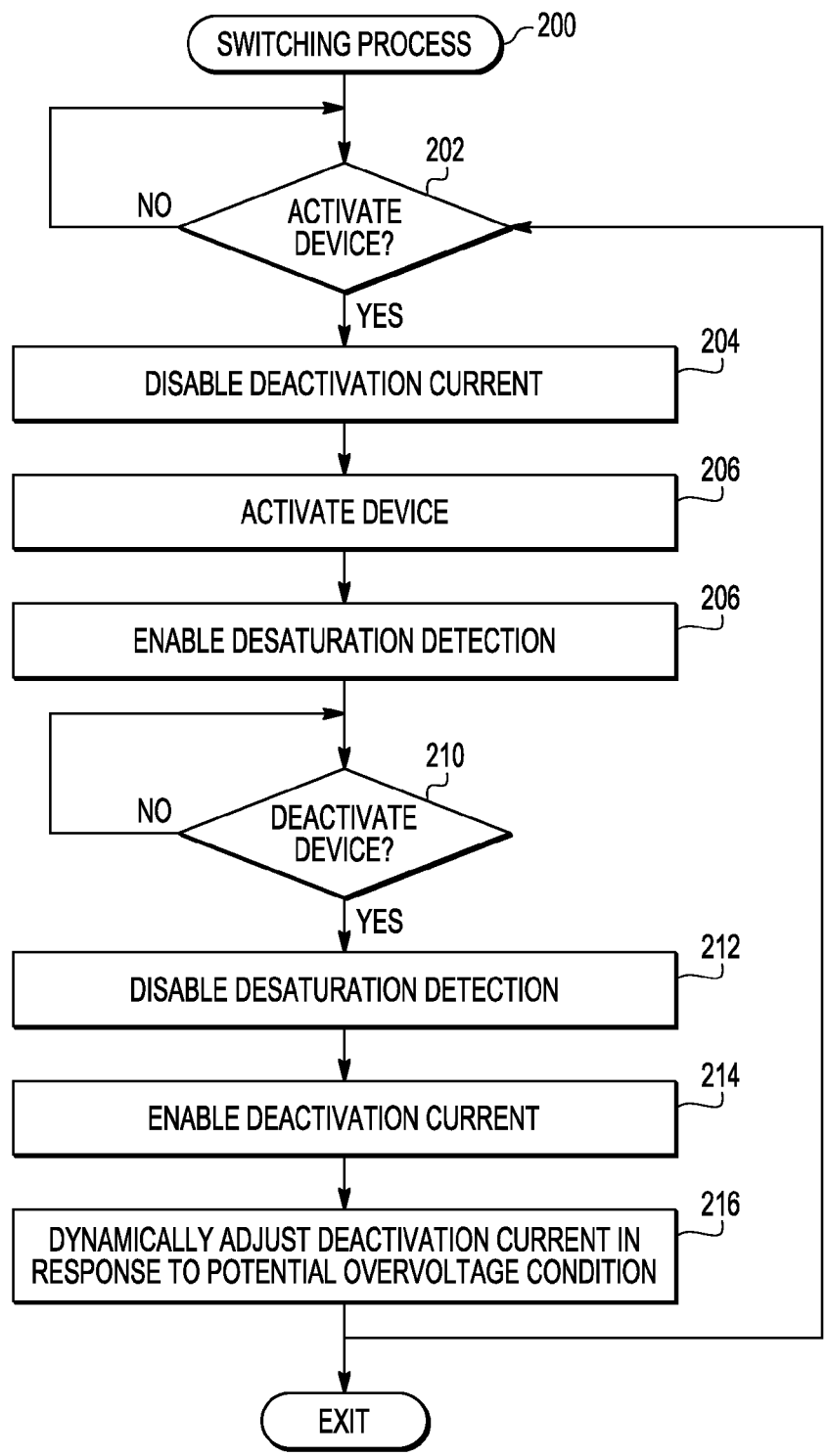
FIG. 2 is a flow diagram illustrating an exemplary switching process suitable for implementation by the gate driver in the electrical system of FIG. 1 in accordance with one embodiment of the invention.
Figure 3:
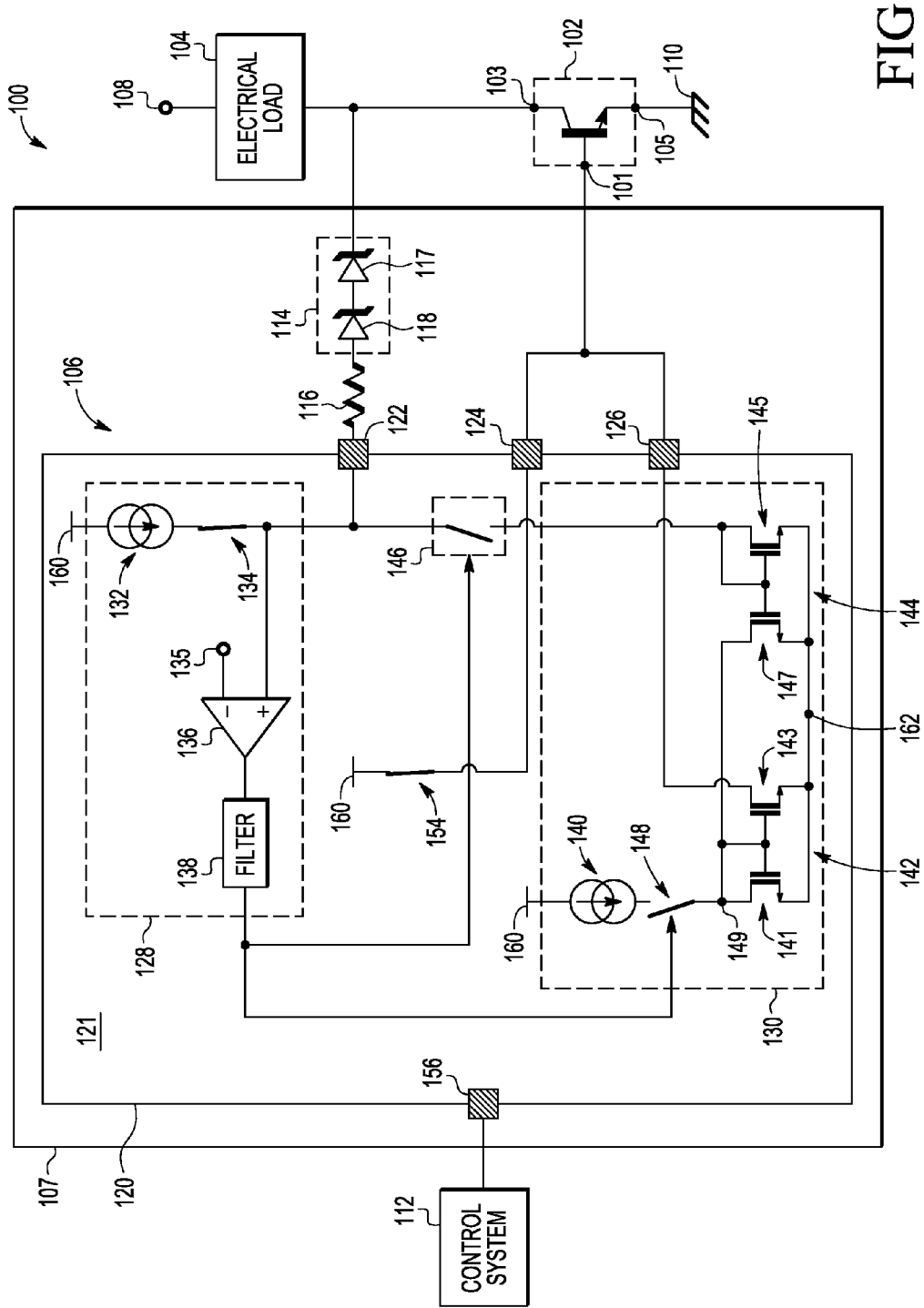
FIG. 3 is a schematic diagram illustrating the effective state of the gate driver in the electrical system of FIG. 1 to activate the switching device.

FIG. 2 depicts an exemplary embodiment of a switching process 200 suitable for implementation by a drive system to operate a device while also providing protection from both desaturation conditions and potentially damaging turn-off over-voltages. In exemplary embodiments, the switching process 200 is performed by the gate driver 120 to operate the switching device 102. The switching process 200 begins by identifying or otherwise determining that the device should be activated, and in response to determining the device should be activated, disabling the deactivation current, activating the device, and enabling desaturation detection (tasks 202, 204, 206, 208). For example, as described above, the gate driver 120 identifies that the switching device 102 should be activated in response to receiving an indication from the control system 112 (e.g., a logical high voltage at the input interface 156). In this regard, FIG. 3 depicts the effective state of the gate driver 120 in response to a logical high voltage signal at the input interface 156. As illustrated in FIG. 3, in response to the indication to activate the switching device 102, the gate driver 120 disables or otherwise deactivates the deactivation arrangement 130 (e.g., by opening, turning off, or otherwise deactivating switching elements 146, 148) and activates the switching element 154 to provide the positive gate driver reference voltage to the gate terminal 101 at the first gate terminal interface 124, thereby activating the switching device 102. Additionally, the gate driver 120 enables or otherwise activates the desaturation detection arrangement 128 by closing, turning on, or otherwise activating the switching element 134 to provide the desaturation reference current to the collector terminal interface 122. Thereafter, the desaturation detection arrangement 128 and/or comparator arrangement 136 monitors the voltage at the collector terminal interface 122 for a voltage indicative of a desaturation condition.

Figure 4:
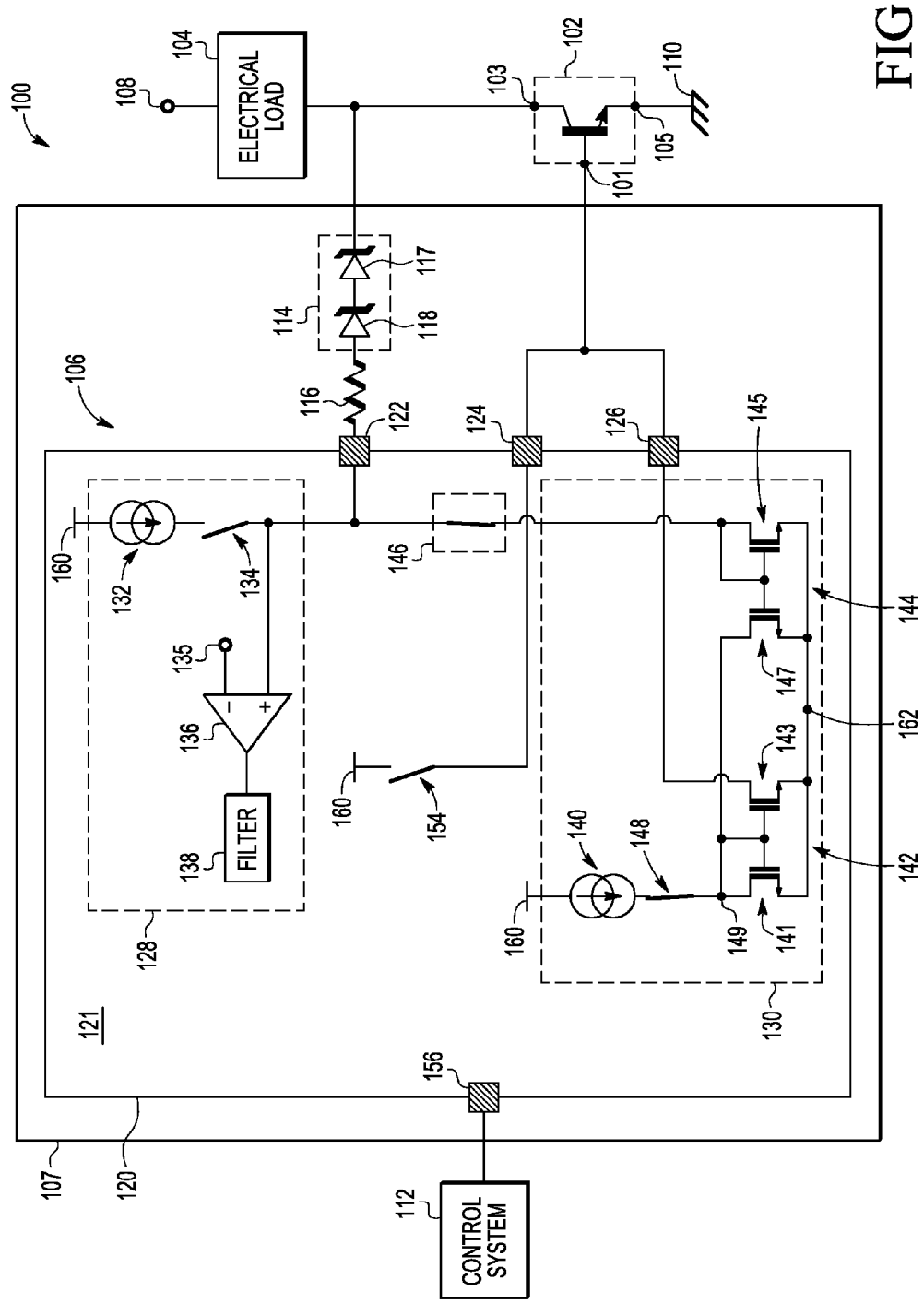
FIG. 4 is a schematic diagram illustrating the effective state of the gate driver in the electrical system of FIG. 1 to deactivate the switching device.

Referring again to FIG. 2, the switching process 200 continues by identifying or otherwise determining whether the device should be deactivated, and in response to determining the device should be deactivated, disabling the desaturation detection, enabling the deactivation current provided to the device to deactivate the device, and dynamically adjusting the deactivation current while deactivating the device (tasks 210, 212, 214, 216). For example, as described above, the gate driver 120 identifies that the switching device 102 should be deactivated either in response to receiving an indication from the control system 112 (e.g., a logical low voltage at the input interface 156) or in response to the desaturation detection arrangement 128 detecting a desaturation condition of the switching device 102 (e.g., a logical high voltage output by the comparator arrangement 136 and/or filter 138). In this regard, FIG. 4 depicts the effective state of the gate driver 120 in response to a logical low voltage signal at the input interface 156. As illustrated in FIG. 4, in response to an indication to deactivate the switching device, the gate driver 120 disables or otherwise deactivates the desaturation detection arrangement 128 by opening, turning off, or otherwise deactivating the switching element 134 and enables or otherwise activates the deactivation arrangement 130 by closing, turning on, or otherwise activating the switching elements 146, 148 and opening, turning off, or otherwise deactivating switching element 154. The deactivation reference current source 140 thereafter provides a reference current to the first current mirror arrangement 142, which mirrors the reference current to draw the deactivation current from the gate terminal 101 at the second gate terminal interface 126 and deactivate the switching device 102. As described above, in accordance with one or more embodiments, the gate driver 120 is configured to operate the deactivation reference current source 140 to provide an initially higher deactivation current at the second gate terminal interface 126 to accelerate the initial deactivation of the switching device 102 before reducing the reference current. In this regard, the duration for which the initially higher reference current is provided by the deactivation reference current source 140 may be chosen to be less than the likely amount of time required for the voltage at the collector terminal 103 to exceed the reverse bias voltage of the zener diode arrangement 114 so that the higher deactivation current is not being provided to the gate terminal 101 whenever the voltage at the collector terminal 103 exceeds the reverse bias voltage of the zener diode arrangement 114. For example, the gate driver 120 and/or deactivation reference current source 140 may be configured to initially provide a reference current at node 149 that results in an initial deactivation current at the second gate terminal interface 126 of about 12 amperes for about 50 nanoseconds to about 150 nanoseconds before reducing the reference current at node 149 to provide a deactivation current at the second gate terminal interface 126 of about 2 amperes thereafter.

As described above, whenever the voltage at the collector terminal 103 exceeds the reverse bias voltage of the zener diode arrangement 114, the deactivation arrangement 130 dynamically adjusts the deactivation current provided at the second gate terminal interface 126 based on the voltage at the collector terminal interface 122 by subtracting, from the reference current at node 149, an amount of current corresponding to the current flowing into the collector terminal interface 122 and through the second current mirror arrangement 144. As the voltage at the collector terminal interface 122 dynamically increases and/or decreases, the corresponding current through the transistor 145 increases and/or decreases, thereby causing the deactivation current at the second gate terminal interface 126 to dynamically increase and/or decrease until the switching device 102 is safely deactivated. In this manner, the deactivation arrangement 130 dynamically adjusts the rate at which the switching device 102 is turned off to mitigate generation of turn-off voltages by inductances within the electrical system 100 by actively clamping the voltage at the collector terminal 103 to the reverse bias voltage of the zener diode arrangement 114. In exemplary embodiments, the switching process 200 repeats throughout operation of the electrical system 100 to continuously protect the switching device 102.

Referring again to FIGS. 3-4, as described above, the gate driver 120 may also identify that the switching device 102 should be deactivated either in response to the desaturation detection arrangement 128 detecting a desaturation condition of the switching device 102. In this regard, although not illustrated in FIG. 4, in response to detecting a potential desaturation condition, the desaturation detection arrangement 128 activates or otherwise turns on the switching elements 146, 148 and deactivates or otherwise turns off switching element 154 while a logical high input signal is provided at package interface 156, in which case, the switching element 134 may be maintained closed. As the switching device 102 is turned off by the deactivation arrangement 130, the voltage at the interface 122 increases and is thereby maintained above the reference voltage at node 135, thereby ensuring that switching elements 146, 148 are maintained in their activated state and switching element 154 is maintained in its deactivated state to turn off the switching device 102 until the control system 112 stops providing a logical high input signal at the package interface 156. In this manner, the desaturation detection arrangement 128 protects the switching device 102 from a potential desaturation condition.

For the sake of brevity, conventional techniques related to current sources and/or current mirrors, biasing, logic gates, integrated circuit fabrication, device packaging, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

A gate driver system comprising an interface for coupling to a switching device, a first arrangement coupled to the interface to detect a desaturation condition based on an electrical characteristic at the interface, and a second arrangement coupled to the interface to deactivate the switching device in a manner that is influenced by the electrical characteristic at the interface. In one embodiment, the first arrangement and the second arrangement are encapsulated in a device package and the interface comprises a pin of the device package. In another embodiment, the gate driver system further comprises a zener diode arrangement coupled to the interface, wherein the zener diode arrangement comprises one or more zener diodes configured electrically in series between the interface and a first terminal of the switching device. In one embodiment, the zener diode arrangement comprises a zener diode having an anode terminal coupled to the interface and a cathode terminal coupled to the first terminal of the switching device. In another embodiment, the gate driver system further comprises a second interface for coupling to a second terminal of the switching device, wherein the second arrangement is coupled to the second interface. In a further embodiment, the second terminal comprises a control terminal of a transistor and the first terminal is different than the second terminal In another embodiment, the second arrangement provides a deactivation current at the second interface to deactivate the switching device and adjusts the deactivation current based on the electrical characteristic at the interface. In one embodiment, the second arrangement adjusts the deactivation current by subtracting a current at the interface from a reference current. In another embodiment, the second arrangement comprises a first current mirror arrangement coupled to the second interface to provide the deactivation current at the second interface by mirroring a portion of a reference current at a first node and a second current mirror arrangement coupled to the first node and the interface, wherein the second current mirror arrangement is configured to reduce the portion of the reference current mirrored by the first current mirror arrangement based on a voltage at the interface. In yet another embodiment, the gate driver system further comprises a second interface for coupling to a control terminal of the switching device, wherein the second arrangement comprises a first current mirror arrangement coupled to the second interface to provide a deactivation current at the second interface and a second current mirror arrangement coupled to the first current mirror arrangement and the interface to adjust the deactivation current based on the electrical characteristic at the interface. In another embodiment, the gate driver system further comprises a second interface for coupling to a control terminal of the switching device, wherein the first arrangement is coupled to the second arrangement to enable a deactivation current at the second interface when the electrical characteristic at the interface indicates the desaturation condition and the deactivation current is influenced by the electrical characteristic at the interface. In one embodiment, the first arrangement detects the desaturation condition based on a voltage at the interface and the second arrangement reduces the deactivation current in a manner that is influenced by the voltage at the interface.

In another embodiment, an electrical system is provided that comprises a switching device having a first terminal and a control terminal, a gate driver device having a first package interface coupled to the control terminal and a second package interface, and a zener diode arrangement coupled between the second package interface and the first terminal, the gate driver device comprising a deactivation arrangement coupled to the first package interface and the second package interface and a desaturation detection arrangement coupled to the second package interface. In one embodiment, the deactivation arrangement provides a deactivation current at the first package interface to deactivate the switching device and reduces the deactivation current when a voltage at the second package interface is indicative of the zener diode arrangement being reverse-biased. In another embodiment, the desaturation detection arrangement detects a desaturation condition based on a voltage at the second package interface when the switching device is activated and the deactivation arrangement adjusts a deactivation current provided to the first package interface to deactivate the switching device based on the voltage at the second package interface. In another embodiment, the deactivation arrangement comprises a reference current source to provide a reference current, a first current mirror arrangement coupled to the reference current source and the first package interface to mirror a portion of the reference current at the first package interface, and a second current mirror arrangement coupled to the reference current source and the second package interface to reduce the portion of the reference current mirrored at the first package interface based on a voltage at the second package interface.

In yet another embodiment, a method is provided for protecting a switching device using a gate driver device having a first package interface coupled to a control terminal of the switching device and a second package interface coupled to a second terminal of the switching device. The method comprises providing a deactivation current at the first package interface in response to an indication to deactivate the switching device and adjusting the deactivation current at the first package interface based on an electrical characteristic at the second package interface. In one embodiment, adjusting the deactivation current comprises reducing the deactivation current based on a current at the second package interface. In another embodiment, the method further comprises monitoring the electrical characteristic at the second package interface for the desaturation condition prior to providing the deactivation current to the first package interface, wherein providing the deactivation current comprises providing the deactivation current in response to the desaturation condition. In one embodiment, monitoring the electrical characteristic comprises monitoring a voltage at the second package interface for the desaturation condition when the switching device is activated and adjusting the deactivation current at the first package interface comprises adjusting the deactivation current based on the voltage at the second package interface after providing the deactivation current to the first package interface.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A gate driver system comprising:
   a first pin of a device package for coupling to a switching device;
   a second pin of the device package for coupling to the switching device;
   a first arrangement encapsulated in the device package and coupled to the first pin to detect a desaturation condition based on an electrical characteristic at the first pin; and
   a second arrangement encapsulated in the device package and coupled to the first pin and the second pin to:
      provide a deactivation current at the second pin to deactivate the switching device; and
      dynamically adjust the deactivation current at the second pin based on the electrical characteristic at the first pin.

2. The gate driver system of claim 1, further comprising a zener diode arrangement coupled to the first pin, wherein the zener diode arrangement comprises one or more zener diodes configured electrically in series between the first pin and a first terminal of the switching device.

3. The gate driver system of claim 2, wherein the zener diode arrangement comprises a zener diode having an anode terminal coupled to the first pin and a cathode terminal coupled to the first terminal of the switching device.

4. The gate driver system of claim 1, wherein the first pin is coupled to a first terminal of the switching device and the second pin is coupled to a second terminal of the switching device.

5. The gate driver system of claim 4, wherein:
   the second terminal comprises a control terminal of a transistor; and
   the first terminal is different than the second terminal.

6. The gate driver system of claim 1, wherein the second arrangement comprises:
   a first current mirror arrangement coupled to the second pin to provide the deactivation current at the second pin by mirroring a portion of a reference current at a first node; and
   a second current mirror arrangement coupled to the first node and the first pin, wherein the second current mirror arrangement is configured to reduce the portion of the reference current mirrored by the first current mirror arrangement based on a voltage at the first pin.

7. The gate driver system of claim 1, wherein the second arrangement comprises:

a first current mirror arrangement coupled to the second pin to provide a deactivation current at the second pin; and a second current mirror arrangement coupled to the first current mirror arrangement and the first pin to adjust the deactivation current based on the electrical characteristic at the first pin.

8. The gate driver system of claim 1, wherein:
the first arrangement is coupled to the second arrangement to enable the deactivation current at the second pin when the electrical characteristic at the first pin indicates the desaturation condition.

9. The gate driver system of claim 8, wherein:
the first arrangement detects the desaturation condition based on a voltage at the first pin; and
the second arrangement reduces the deactivation current in a manner that is influenced by the voltage at the first pin.

10. A gate driver system comprising:
a first interface for coupling to a first terminal of a switching device;
a second interface for coupling to a second terminal of the switching device;
a first arrangement coupled to the first interface to detect a desaturation condition based on an electrical characteristic at the first interface; and
a second arrangement coupled to the first interface and the second interface to:
   provide a deactivation current at the second interface to deactivate the switching device deactivate the switching device; and
   adjust the deactivation current at the second interface by subtracting a current at the first interface from a reference current.

11. An electrical system comprising:
a switching device having a first terminal and a control terminal;
a gate driver device having a first package interface coupled to the control terminal and a second package interface, the gate driver device comprising:
   a deactivation arrangement coupled to the first package interface and the second package interface to provide a deactivation current at the first package interface to deactivate the switching device and dynamically adjust the deactivation current based on an electrical characteristic at the second package interface; and
   a desaturation detection arrangement coupled to the second package interface to detect a desaturation condition based on the electrical characteristic at the second package interface; and
a zener diode arrangement coupled between the second package interface and the first terminal.

12. The electrical system of claim 11, wherein the deactivation arrangement reduces the deactivation current when a voltage at the second package interface is indicative of the zener diode arrangement being reverse-biased.

13. The electrical system of claim 11, wherein:
the desaturation detection arrangement detects the desaturation condition based on a voltage at the second package interface when the switching device is activated; and
the deactivation arrangement dynamically adjusts the deactivation current provided to the first package interface to deactivate the switching device based on the voltage at the second package interface.

14. The electrical system of claim 11, wherein the deactivation arrangement comprises:
a reference current source to provide a reference current;
a first current mirror arrangement coupled to the reference current source and the first package interface to mirror a portion of the reference current at the first package interface; and
a second current mirror arrangement coupled to the reference current source and the second package interface to reduce the portion of the reference current mirrored at the first package interface based on a voltage at the second package interface.

15. A method of protecting a switching device using a gate driver device having a first package interface coupled to a control terminal of the switching device and a second package interface coupled to a second terminal of the switching device, the method comprising:
monitoring an electrical characteristic at the second package interface for a desaturation condition;
providing a deactivation current at the first package interface in response to an indication to deactivate the switching device in response to the desaturation condition; and
dynamically adjusting the deactivation current at the first package interface based on the electrical characteristic at the second package interface.

16. The method of claim 15, wherein adjusting the deactivation current comprises reducing the deactivation current based on a current at the second package interface.

17. The method of claim 15, wherein:
monitoring the electrical characteristic comprises monitoring a voltage at the second package interface for the desaturation condition when the switching device is activated; and
adjusting the deactivation current at the first package interface comprises adjusting the deactivation current based on the voltage at the second package interface after providing the deactivation current to the first package interface.

* * * * *